United States Patent
Kim et al.

(10) Patent No.: US 9,099,685 B2
(45) Date of Patent: Aug. 4, 2015

(54) ORGANIC LIGHT EMITTING DIODE DISPLAY AND METHOD OF MANUFACTURING THE SAME

(71) Applicant: Samsung Display Co., Ltd., Yongin, Gyeonggi-do (KR)

(72) Inventors: Yong-Jin Kim, Yongin (KR); Chi-Wook An, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/911,821

(22) Filed: Jun. 6, 2013

(65) Prior Publication Data

US 2014/0138640 A1    May 22, 2014

(30) Foreign Application Priority Data

Nov. 20, 2012    (KR) .......................... 10-2012-0131872

(51) Int. Cl.
| | | |
|---|---|---|
| *H01L 51/56* | (2006.01) | |
| *H01L 27/32* | (2006.01) | |
| *H01L 51/00* | (2006.01) | |
| *H01L 51/52* | (2006.01) | |

(52) U.S. Cl.
CPC ............ *H01L 51/56* (2013.01); *H01L 27/3272* (2013.01); *H01L 51/0097* (2013.01); *H01L 51/5253* (2013.01); *H01L 2251/5338* (2013.01); *Y02E 10/549* (2013.01)

(58) Field of Classification Search
CPC .......................... H01L 21/3272; H01L 51/56
USPC ................................................ 438/26; 257/40
See application file for complete search history.

(56) References Cited

U.S. PATENT DOCUMENTS

| | | | |
|---|---|---|---|
| 7,259,106 B2 * | 8/2007 | Jain ............................. | 438/737 |
| 8,619,363 B1 * | 12/2013 | Coleman ...................... | 359/576 |
| 2004/0160178 A1 * | 8/2004 | Qiu et al. ..................... | 313/512 |
| 2007/0120469 A1 * | 5/2007 | Ha et al. ...................... | 313/504 |
| 2013/0140547 A1 * | 6/2013 | Lee et al. ..................... | 257/40 |

FOREIGN PATENT DOCUMENTS

| | | | | |
|---|---|---|---|---|
| JP | 2001-176653 A | 6/2001 | | |
| JP | 2003-205574 A | 7/2003 | | |
| JP | 2005-347083 A | 12/2005 | | |
| JP | 2003-205574 | * | 7/2014 | ............... B32B 9/00 |
| KR | 10-2011-0065077 A | 6/2011 | | |
| KR | 10-2011-0070472 A | 6/2011 | | |

* cited by examiner

*Primary Examiner* — David S Blum
(74) *Attorney, Agent, or Firm* — Knobbe Martens Olson & Bear LLP (57) ABSTRACT

An organic light emitting diode (OLED) display that is flexible is disclosed. According to one aspect it includes: a flexible substrate, a moisture permeation preventing layer formed on the flexible substrate, a barrier layer formed on the moisture permeation preventing layer, an OLED formed on the barrier layer, a thin film encapsulation layer covering the OLED, and a lower protection film attached beneath the flexible substrate.

16 Claims, 5 Drawing Sheets

ORGANIC LIGHT EMITTING DIODE DISPLAY AND METHOD OF MANUFACTURING THE SAME

CROSS-REFERENCE TO RELATED APPLICATIONS

This application claims priority to and the benefit of Korean Patent Application No. 10-2012-0131872 filed in the Korean Intellectual Property Office on Nov. 20, 2012, the entire contents of which are incorporated herein by reference.

BACKGROUND

1. Field

The described technology relates generally to an organic light emitting diode (OLED) display and a method of manufacturing the same.

2. Description of the Related Technology

An OLED display includes OLEDs made up of a hole injection electrode, an organic emission layer, and an electron injection electrode. Each OLED emits light which is generated when an exciton generated by combining electrons and holes in the organic emission layer falls from an exited state to a bottom state.

Since the OLED may deteriorate by external factors such as external moisture, oxygen, or ultraviolet (UV) rays, a packaging technology which seals the OLED is needed, and the OLED display needs to be thin or manufactured to be easily bent, so that the OLED display can be used in various applications. A thin film encapsulation (TFE) technology has been developed in order to seal the OLED and thinly form the OLED display to be bent. The thin film encapsulation technology is a technology in which one or more inorganic layers and organic layers are alternately laminated on the OLEDs formed in a display region of a display substrate to cover the display region with a thin film encapsulation layer. In the case where the display substrate of the OLED display having the thin film encapsulation layer is formed of a flexible film such as polyimide, the display substrate may be easily bent and may be thin. In the case where the display substrate is formed of the flexible film, a barrier layer is formed on the flexible film and the OLED is formed thereon in order to prevent external moisture from flowing from the outside through the flexible film and gas from being generated from the flexible film.

However, since polyimide is a material having high viscosity, which is applied and then cured to be manufactured as the flexible film, a protrusion portion or a recess portion may be formed on the surface of the flexible film by particles when the flexible film is applied. The protrusion portion or the recess portion of the flexible film may apply a damage to the barrier layer thereon to generate cracks on the barrier layer. Accordingly, external moisture may seep through the cracks of the barrier layer, damaging the OLEDs, and causing dark points and the like in the OLED display.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

The described technology has been made in an effort to provide an OLED display that can prevent permeation of external moisture, and a method of manufacturing the same.

In one aspect, an OLED display comprises a flexible substrate; a moisture permeation preventing layer formed on the flexible substrate; a barrier layer formed on the moisture permeation preventing layer; an OLED formed on the barrier layer; a thin film encapsulation layer covering the OLED; and a lower protection film attached beneath the flexible substrate.

In some embodiments, the moisture permeation preventing layer comprises a liquid absorber.

In some embodiments, the liquid absorber comprises a calcium oxide (CaO)-based material.

In some embodiments, the OLED comprises a gate line formed on a display substrate and transferring a scan signal, a data line and a driving voltage line dielectrically crossing the gate line and transferring a data signal and a driving voltage, respectively, a switching thin film transistor connected to the gate line and the data line, a driving thin film transistor connected to the switching thin film transistor and the driving voltage line, an anode connected to the driving thin film transistor, an organic light emitting member formed on the anode, and a cathode formed on the organic light emitting member.

In some embodiments, the flexible substrate comprises polyimide.

In some embodiments, the lower protection film comprises a carrier film, an adhesive layer, and an anti-static layer.

Another aspect relates to a method of manufacturing an OLED display, comprising forming a flexible substrate on a support substrate; forming a moisture permeation preventing layer on the flexible substrate; forming a barrier layer on the moisture permeation preventing layer; forming an OLED on the barrier layer, and forming a thin film encapsulation layer on the OLED.

In some embodiments, the moisture permeation preventing layer includes a liquid absorber.

In some embodiments, the liquid absorber comprises a calcium oxide (CaO)-based material.

In some embodiments, the moisture permeation preventing layer comprises applying the liquid absorber on the flexible substrate by using a coater, and thermally curing the applied liquid absorber.

In some embodiments, the method further comprises separating the support substrate from the flexible substrate, and attaching a lower protection film beneath the flexible substrate. The method of claim 11, wherein the lower protection film comprises a carrier layer, an adhesive layer, and an anti-static layer.

According to the exemplary embodiments, in an OLED display, it is possible to prevent cracks of a barrier layer by a protrusion portion or a recess portion formed on a surface of a flexible substrate by forming a moisture permeation preventing layer between the flexible substrate and the barrier layer.

Accordingly, it is possible to prevent external moisture from flowing into an OLED through the damaged barrier layer, thereby minimizing progressive dark point defects and the like.

Further, it is possible to prevent damage to the OLED due to external moisture by forming the moisture permeation preventing layer using a liquid getter having excellent hygroscopicity to absorb external moisture flowing through the flexible substrate that moisture easily permeates.

DETAILED DESCRIPTION

The present development will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification unless context dictates otherwise.

Further, the size and thickness of each component shown in the drawings are shown for understanding and ease of description and may not be to scale, but the present development is not limited thereto. In the drawings, the thickness of layers, films, panels, regions, etc., may be exaggerated for clarity.

It will be understood that when an element such as a layer, film, region, or substrate is referred to as being "on" another element, it can be directly on the other element or intervening elements may also be present. Further, unless explicitly described to the contrary, the word "comprise" and variations such as "comprises" or "comprising", will be understood to imply the inclusion of stated elements but not the exclusion of any other elements. In addition, in the specification, the word "on" means positioning on or below the object portion, but does not essentially mean positioning on the upper side of the object portion based on a gravity direction.

In the accompanying drawings, an active matrix (AM) type OLED display having a 2Tr-1Cap structure which includes two thin film transistors (TFT) and one capacitor in one pixel is illustrated, but the present development is not limited thereto. Accordingly, the OLED display may include a plurality of thin film transistors and at least one capacitor in one pixel, and may be formed to have various structures by further forming a separate wire or omitting a known wire. Here, the pixel means a minimum unit displaying an image, and the OLED display displays the image using a plurality of pixels.

Hereinafter, an OLED display according to an exemplary embodiment will be described in detail with reference to FIGS. 1 and 2.

Figure 1:
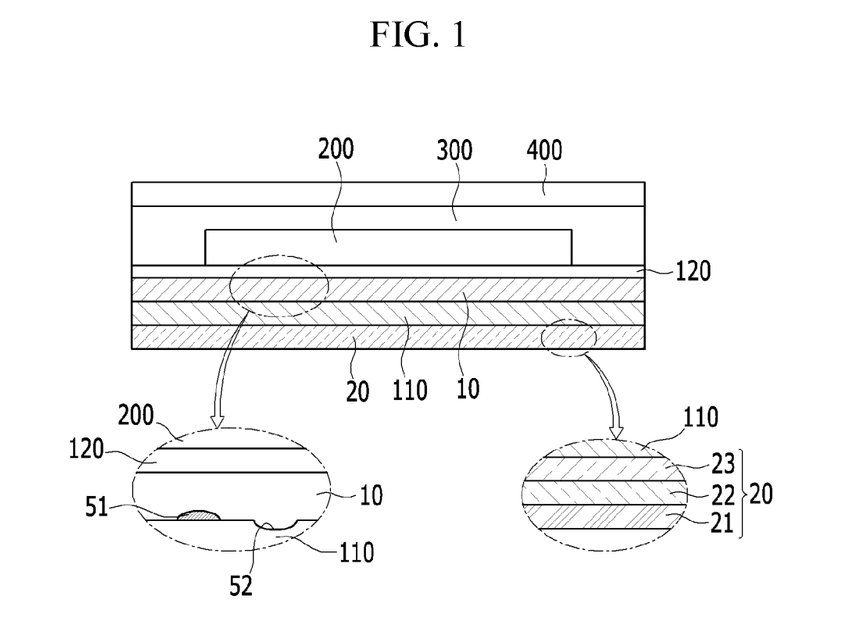
FIG. 1 is a cross-sectional view of an OLED display according to an exemplary embodiment.
Figure 2:
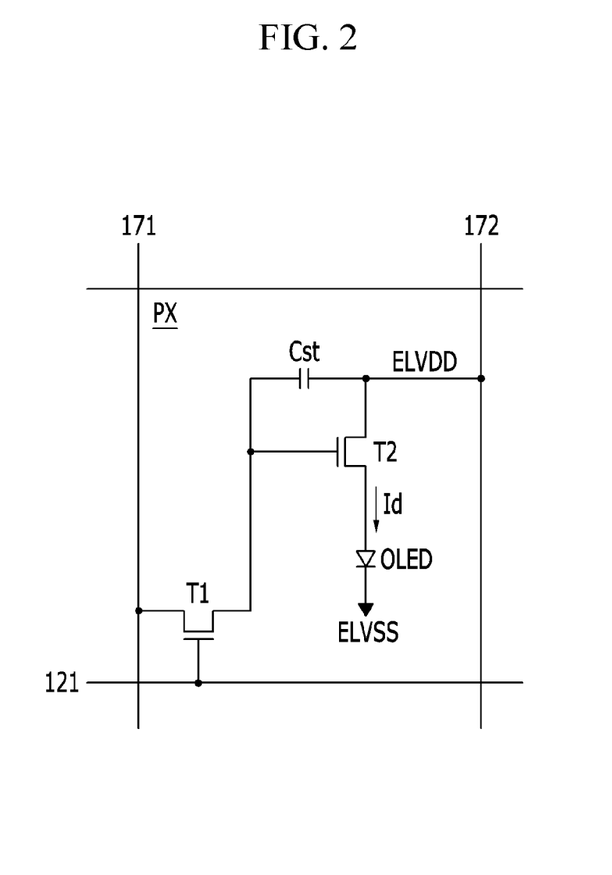
FIG. 2 is an equivalent circuit view of one pixel of the OLED display according to the exemplary embodiment.

FIG. 1 is a cross-sectional view of an embodiment of an OLED display, and FIG. 2 is an equivalent circuit view of one pixel of the OLED display of the OLED display of FIG. 1.

As illustrated in FIG. 1, the OLED display includes a flexible substrate 110, a moisture permeation preventing layer 10 formed on the flexible substrate, a barrier layer 120 formed on the moisture permeation preventing layer, an OLED 200 formed on the barrier layer 120, a thin film encapsulation layer 300 covering the OLED 200, and a lower protection film 20 disposed beneath the flexible substrate. In some embodiments, the lower protective film 20 is attached to the flexible substrate 110.

The flexible substrate 110 may comprise a flexible film such as polyimide. In some embodiments, the flexible substrate 110 is formed by providing a material having a high viscosity, such as polyimide, and then curing the material. During formation of the flexible substrate 110, a protrusion portion 51 and/or a recess portion 52 may be formed on the surface of the flexible substrate 110 due to the presence of particles when the flexible substrate 110 is formed. The moisture permeation preventing layer 10 may include a liquid absorber. In some embodiments, the liquid absorber may comprise a calcium oxide (CaO)-based material.

The moisture permeation preventing layer 10 may cover the protrusion portion 51 or the recess portion 52 of the flexible substrate 110 to block a permeation path of external moisture and prevent cracks of the barrier layer 120 by the protrusion portion 51 or the recess portion 52 of the flexible substrate 110.

The moisture permeation preventing layer 10 may be formed with a variety of thicknesses. In some embodiments, the permeation prevention layer may be from about 15 μm to 17 μm thick. Where the thickness of the moisture permeation preventing layer 10 is less than about 15 μm, it may be difficult to block external moisture, and where the thickness of the moisture permeation preventing layer 10 is more than about 17 μm, the degree of bending of the flexible substrate 110 is suppressed, which may increase the possibility of occurrence of cracks due to stress.

In some embodiments, the barrier layer 120 may be formed to have a single layer of silicon nitride (SiNx). In some embodiments, the barrier layer 120 may be formed to have a double layer structure of silicon nitride (SiNx) and silicon oxide (SiO2) being laminated together. The barrier layer 120 serves to prevent contaminants such as impurities or moisture from permeating and planarizing the surface. In some embodiments, the barrier layer 120 may have a thickness of about 0.5 μm to about 1 μm. Where the thickness of the barrier layer 120 is less than about 0.5 μm, it may be difficult to block external moisture, thus impairing operation of the OLED 200. Where the thickness of the barrier layer 120 is more than about 1 μm, the degree of bending of the flexible substrate 110 is suppressed, which may increase the possibility of occurrence of cracks by stress, thus easily causing dark point defects in low grayscale driving of the OLED display.

The OLED display also comprises a thin film encapsulation layer 300 covering the OLED 200 and a polarizing plate 400. The thin film encapsulation layer 300 may prevent oxygen and moisture from flowing into the OLED 200 from an external environment, thus protecting the OLED 200.

The polarizing plate 400 may be disposed on the thin film encapsulation layer 300 to prevent reflection of external light. The polarizing plate 400 and the thin film encapsulation layer 300 may be thin, and may be damaged by stabbing or scratching by external scraping or impurities generated during the manufacturing process. Accordingly, defects such as dark points occur on the display. In some embodiments, an upper protection film (not shown) may be attached on the polarizing plate 400 in order to prevent the damage to the thin film encapsulation layer 300 and the polarizing plate 400. The upper protection film protects the thin film encapsulation layer 300 and the polarizing plate 400 while the manufacturing process is performed. Following manufacturing the OLED display, the upper protection film may be removed.

The lower protection film 20 comprises a carrier film 21, an adhesive layer 22 formed on the carrier film 21, and an antistatic layer 23 attached on the adhesive layer 22 configured to remove static electricity. The carrier film 21 may comprise polyethylene terephthalate (PET), polyethylene naphthalate (PEN), polyethylene sulfide (PES), and polyethylene (PE), or any other desired component.

The thickness of the carrier film 21 may be from about 25 μm to about 300 μm. Where the thickness of the carrier film 21 is less than about 25 μm, it may be difficult for the carrier film to serve as the lower protection film protecting a lower portion of the OLED display. Where the thickness of the carrier film 21 is more than about 300 μm, when the lower protection film for the display is attached to the OLED display, it may impair the flexibility of the OLED display.

Unlike the upper protection film, which may be removed after manufacturing is complete, the lower protection film 20 needs to be permanently attached to the display substrate. Accordingly, the adhesive layer 22 may be used. The adhesive layer 22 has high adhesion strength. That is, since the lower protection film 20 may not be removed while performing the manufacturing process, the adhesive layer 22 may be a strongly adhesive acrylic film, and adhesion strength of the adhesive layer 22 may be about 500 gf/inch or more in the case where a subject material is steel use stainless (SUS).

The flexible substrate 110 and the lower protection film 20 are not separated from each other even when the lower protection film 20 is bent, by improving repulsion resistance of the adhesive layer 22. The antistatic layer 23 is formed of a conductive polymer material, for example, poly(3,4-ethylenedioxythiophene) (PEDOT)-based material, and formed in a thickness of about 20 nm to about 100 nm by using a gravure coating method. In the case where the thickness of the antistatic layer 23 is smaller than about 20 nm, it is difficult to secure an antistatic function of preventing static electricity, and in the case where the thickness of the antistatic layer 23 is larger than about 100 nm, the thickness of the lower protection film 20 is increased too much, and flexibility may be impaired.

The antistatic layer 23 removes static electricity occurring in the case where a support substrate 1 (see FIG. 4) is removed from the flexible substrate 20 to prevent driving inferiority occurring in the OLED display due to a change in characteristic of the thin film transistor of the OLED display by static electricity.

The lower protection film 20 is attached beneath the flexible substrate 110, and specifically, the adhesive layer 22 and the antistatic layer 23 of the lower protection film 20 are attached to the flexible substrate 110. Since the antistatic layer 23 covers a portion of the adhesive layer 22, the adhesive layer 22 may be attached to the flexible substrate 110.

As described above, since the flexible substrate 110 is covered by the lower protection film 20, the flexible substrate 110 does not directly come into physical contact with the external environment. Accordingly, the lower protection film 20 provides protection from physical damage to the flexible substrate 110.

Further, it is possible to prevent driving inferiority of the OLED display by static electricity occurring when the support substrate is removed from the flexible substrate 20 by forming the antistatic layer 23 for removing static electricity on the lower protection film 20 attached to the flexible substrate 110. Accordingly, it is possible to prevent a mura phenomenon from occurring.

As described above, cracks of the barrier layer 120 due to the protrusion portion 51 or the recess portion 52 formed on the surface of the flexible substrate 110 may be prevented by forming the moisture permeation preventing layer 10 between the flexible substrate 110 and the barrier layer 120.

Accordingly, the embodiments described herein may prevent external moisture from flowing into an OLED 200 through the damaged barrier layer 120, thereby minimizing progressive dark point defects and the like.

Further, in the embodiments described herein, damage of the OLED 200 due to external moisture may be prevented by forming the moisture permeation preventing layer 10 comprising a liquid absorber having excellent hygroscopicity to absorb external moisture flowing through the flexible substrate 110.

The detailed structure of the OLED of the OLED display illustrated in FIG. 1 will now be described in detail with reference to FIG. 2.

As illustrated in FIG. 2, the OLED 200 of the OLED display comprises a plurality of signal lines 121, 171, and 172 and a plurality of pixels PX that are connected thereto and arranged approximately in a matrix form. For simplicity of description, only one pixel PX is illustrated in FIG. 2.

The signal lines include a plurality of scan lines 121 that transfer a scan signal (or gate signal), a plurality of data lines 171 that transfer a data signal, and a plurality of driving voltage lines 172 that transfer the driving voltage (ELVDD). The scan lines 121 extend approximately in a row direction and are substantially parallel to each other, and the data line 171 and the driving voltage line 172 extend approximately in a column direction and are substantially parallel to each other. Each pixel PX includes a switching thin film transistor T1, a driving thin film transistor T2, a storage capacitor Cst, and an OLED.

The switching thin film transistor T1 has a control terminal, an input terminal and an output terminal. The control terminal of the switching thin film transistor T1 is connected to the scan line 121, the input terminal is connected to the data line 171, and the output terminal is connected to the driving thin film transistor T2. The switching thin film transistor T1 responds to a scan signal that is applied to the scan line 121 to transfer a data signal that is applied to the data line 171 to the driving thin film transistor T2.

The driving thin film transistor T2 also has a control terminal, an input terminal and an output terminal. The control terminal of the driving thin film transistor T2 is connected to the switching thin film transistor T1, the input terminal is connected to the driving voltage line 172, and the output terminal is connected to the OLED. The driving thin film transistor T2 allows an output current Id. The output current Id varies according to the voltage that is applied between the control terminal and the output terminal of the driving thin film transistor T2.

The storage capacitor Cst is connected to the control terminal and the input terminal of the driving thin film transistor T2. The storage capacitor Cst charges from application of the data signal to the control terminal of the driving thin film transistor T2, and maintains the data signal, and therefore driving thin film transistor T2 in an on state, even after the switching thin film transistor T1 is turned off.

The OLED has an anode connected to the output terminal of the driving thin film transistor T2, a cathode connected to the common voltage ELVSS, and an organic light emitting member formed between the anode and the cathode.

The OLED displays an image by emitting light, the intensity of which varies according to the output current Id of the driving thin film transistor T2.

The switching thin film transistor T1 and the driving thin film transistor T2 may be an n-channel field effect transistor (FET) or a p-channel field effect transistor. Further, in some embodiments, the connection relationship between the thin film transistors T1 and T2, the capacitor Cst, and the OLED may varied from that depicted in FIG. 2.

Hereinafter, a method of manufacturing an OLED display according to the exemplary embodiment will be described in detail with reference to FIGS. 3 to 5.

Figure 3:
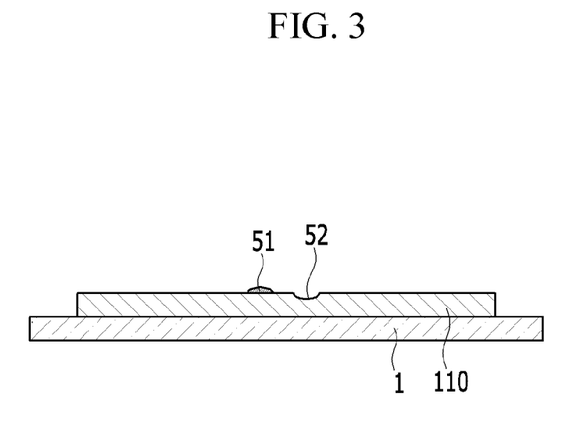
FIGS. 3 to 5 are views sequentially illustrating a method of manufacturing the OLED display according to the exemplary embodiment.
Figure 4:
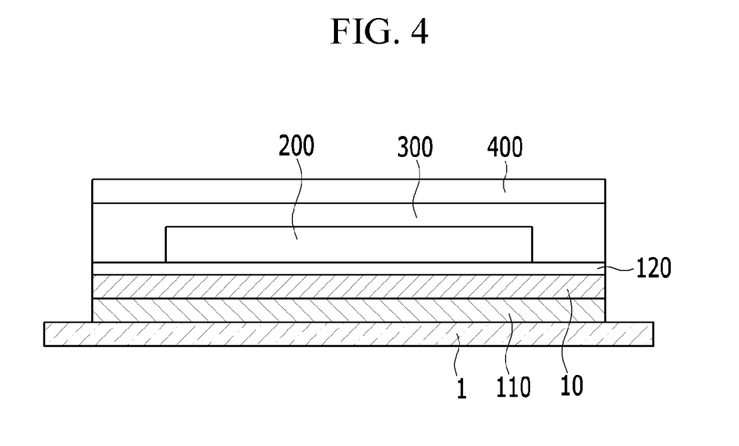
Figure 5:
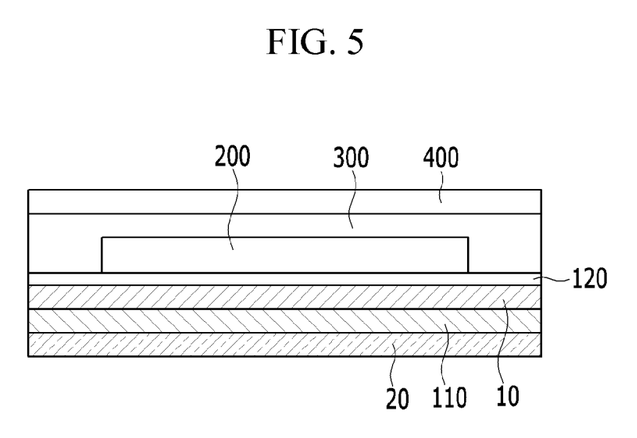

FIGS. 3 to 5 are views which sequentially illustrate an embodiment of a method of manufacturing the OLED display.

First, referring to FIG. 3, the flexible substrate 110 is formed on a support substrate 1. The support substrate 1 supports the flexible substrate 110 during forming, so that the OLED 200 is easily formed on the flexible substrate 110.

Since the flexible substrate 110 is formed by applying a material having high viscosity, such as polyimide, and then curing the material, a protrusion portion 51 or a recess portion 52 may be formed on the surface of the flexible substrate 110 by particles present in the polyimide when the flexible substrate 110 is formed.

Next, as illustrated in FIG. 4, the moisture permeation preventing layer 10 is formed on the flexible substrate 110. The moisture permeation preventing layer 10 comprises the liquid absorber, and the liquid absorber may comprise a calcium oxide (CaO)-based material. The moisture permeation preventing layer 10 has viscosity that is higher than that of a general photoresist (PR), and has high viscosity, for example, of tens of thousands cP (centi poise).

During formation of the moisture permeation preventing layer 10, the liquid absorber may be applied on the flexible substrate 110 by using a coater. The moisture permeation preventing layer 10 may be completed by thermally curing the applied liquid absorber. The moisture permeation preventing layer 10 covers the protrusion portion 51 or the recess portion 52 of the flexible substrate 110 to block any permeation paths for external moisture and may prevent cracks of the barrier layer 120 by the protrusion portion 51 or the recess portion 52 of the flexible substrate 110.

Further, since the moisture permeation preventing layer 10 may be formed by using the coater and a baking device for forming the flexible substrate 110, separate equipment may not be required. As described above, the barrier layer 120 may be formed of an inorganic layer of silicon nitride (SiNx) or silicon oxide (SiO2) on the moisture permeation preventing layer 10.

As described above, it is possible to prevent cracks of the barrier layer 120 by the protrusion portion 51 or the recess portion 52 formed on the surface of the flexible substrate 110 by forming the moisture permeation preventing layer 10 between the flexible substrate 110 and the barrier layer 120.

Accordingly, it is possible to prevent external moisture from flowing into the OLED 200 through the damaged barrier layer 120, thereby minimizing progressive dark point defects and the like.

The OLED 200 is formed on the barrier layer 120, the thin film encapsulation layer 300 covering the OLED 200 is formed on the OLED 200, and the polarizing plate 400 is formed on the thin film encapsulation layer 300.

Next, as illustrated in FIG. 5, the support substrate 1 is separated from the flexible substrate 110. In this case, static electricity may build up on the flexible substrate 110 by a friction between the flexible substrate 110 and the support substrate 1 during removal of the support substrate 1. The lower protection film 20 is attached beneath the flexible substrate, and the antistatic layer 23 is placed in contact with the flexible substrate 110 to remove the built up static electricity. The lower protection film 20 includes the carrier film 21, the adhesive layer 22 formed on the carrier film 21, and the antistatic layer 23 formed on the adhesive layer 22 and removing static electricity. Accordingly, it is possible to prevent driving inferiority by preventing a change in characteristic of the thin film transistor of the OLED display by static electricity.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display comprising:
   a flexible substrate having a protrusion portion or a recess portion;
   a moisture permeation preventing layer formed on the flexible substrate and covering the protrusion portion or the recess portion;
   a barrier layer formed on the moisture permeation preventing layer the barrier layer comprising a first layer of silicon nitride and a second layer of silicon oxide;
   an organic light emitting diode formed on the barrier layer;
   a thin film encapsulation layer covering the organic light emitting diode;
   a polarizing plate formed over the thin film encapsulation layer and configured to prevent reflection of external light; and
   a lower protection film attached beneath the flexible substrate.

2. The organic light emitting diode display of claim 1, wherein the moisture permeation preventing layer comprises a liquid absorber.

3. The organic light emitting diode display of claim 1, wherein the liquid absorber comprises a calcium oxide (CaO)-based material.

4. The organic light emitting diode display of claim 1, wherein:
   the organic light emitting diode comprises:
      a gate line formed on a display substrate and transferring a scan signal,
      a data line and a driving voltage line dielectrically crossing the gate line and transferring a data signal and a driving voltage, respectively,
      a switching thin film transistor connected to the gate line and the data line,
      a driving thin film transistor connected to the switching thin film transistor and the driving voltage line,
      an anode connected to the driving thin film transistor,
      an organic light emitting member formed on the anode, and
      a cathode formed on the organic light emitting member.

5. The organic light emitting diode display of claim 1, wherein the flexible substrate comprises polyimide.

6. The organic light emitting diode display of claim 1, wherein the lower protection film comprises a carrier film, an adhesive layer, and an anti-static layer.

7. The organic light emitting diode display of claim 1, wherein the moisture permeation preventing layer having a thickness of from about 15 μm to about 17 μm.

8. The organic light emitting diode display of claim 1, further comprising a removeable upper protection film covering the polarizing plate and configured to protect the polarizing plate and thin film encapsulation layer during manufacturing.

9. A method of manufacturing an organic light emitting diode display, comprising:
   forming a flexible substrate on a support substrate which has a protrusion portion or a recess portion;
   forming a moisture permeation preventing layer on the flexible substrate to cover the protrusion portion or the recess portion;
   forming a barrier layer on the moisture permeation preventing layer, the barrier layer comprising a first layer of silicon nitride and a second layer of silicon oxide;

forming an organic light emitting diode on the barrier layer;

forming a thin film encapsulation layer on the organic light emitting diode; and forming a polarizing plate on the thin film encapsulation layer and so as to prevent reflection of external light.

10. The method of claim 9, wherein the moisture permeation preventing layer includes a liquid absorber.

11. The method of claim 10, wherein the liquid absorber comprises a calcium oxide (CaO)-based material.

12. The method of claim 10, wherein forming the moisture permeation preventing layer comprises:

applying the liquid absorber on the flexible substrate by using a coater, and thermally curing the applied liquid absorber.

13. The method of claim 9, further comprising:

separating the support substrate from the flexible substrate, and attaching a lower protection film beneath the flexible substrate.

14. The method of claim 13, wherein the lower protection film comprises a carrier layer, an adhesive layer, and an antistatic layer.

15. The method of claim 9, wherein the moisture permeation preventing layer having a thickness of from about 15 μm to about 17 μm.

16. The method of claim 9, further comprising forming a removeble upper protection film on the polarizing plate and configured to protect the polarizing plate and thin film encapsulation layer during manufacturing.

* * * * *